United States Patent
Chiu et al.

(10) Patent No.: US 7,888,144 B2
(45) Date of Patent: Feb. 15, 2011

(54) LIGHT-EMITTING DEVICE AND METHOD FOR MAKING THE SAME

(75) Inventors: Ching-Hua Chiu, Taipei (TW); Hung-Wen Huang, Taipei (TW); Hao-Chung Kuo, Taipei (TW); Tien-Chang Lu, Taipei (TW); Shing-Chung Wang, Taipei (TW); Chih-Ming Lai, Taipei (TW)

(73) Assignees: Lite-On Technology Corp., Taipei (TW); National Chiao Tung University, Hsinchu (TW)

( * ) Notice: Subject to any disclaimer, the term of this patent is extended or adjusted under 35 U.S.C. 154(b) by 492 days.

(21) Appl. No.: 11/984,562

(22) Filed: Nov. 20, 2007

(65) Prior Publication Data

US 2009/0020772 A1 Jan. 22, 2009

(30) Foreign Application Priority Data

Jul. 19, 2007 (TW) .............................. 96126350 A (51) Int. Cl.
*H01L 21/00* (2006.01)

(52) U.S. Cl. .................... 438/22; 438/29; 257/E21.216
(58) Field of Classification Search .................. 438/22, 438/29, 48; 257/E21.216
See application file for complete search history.

(56) References Cited

U.S. PATENT DOCUMENTS

| 7,132,677 | B2 | 11/2006 | Kim et al. |
| 7,563,625 | B2 * | 7/2009 | Tran et al. ..................... 438/29 |
| 2005/0214965 | A1 * | 9/2005 | Park et al. ..................... 438/33 |
| 2007/0045660 | A1 * | 3/2007 | Yi et al. ...................... 257/183 |

* cited by examiner

*Primary Examiner*—Walter L Lindsay, Jr.
(74) *Attorney, Agent, or Firm*—Rosenberg, Klein & Lee (57) ABSTRACT

A light-emitting device is capable of emitting a light having a wavelength ranging from 300 to 550 nm, and includes: a substrate; a p-type semiconductor layer disposed on the substrate; an active layer disposed on the p-type semiconductor layer; a n-type semiconductor layer disposed on the active layer and having a waveguide-disposing surface; and a waveguide structure formed on the waveguide-disposing surface of the n-type semiconductor layer and having a plurality of spaced apart nanorods extending from the waveguide-disposing surface.

9 Claims, 9 Drawing Sheets

LIGHT-EMITTING DEVICE AND METHOD FOR MAKING THE SAME

CROSS-REFERENCE TO RELATED APPLICATION

This application claims priority of Taiwanese application no. 096126350, filed on Jul. 19, 2007.

BACKGROUND OF THE INVENTION

1. Field of the Invention

This invention relates to a light-emitting device, more particularly to a light-emitting device including a waveguide structure having a plurality of nanorods formed on a n-type semiconductor layer.

2. Description of the Related Art

It is known in the art that light extraction efficiency of a light-emitting diode is considerably limited due to the laminated layered structure of the light-emitting diode, which can cause total internal reflection of light generated from an active layer of the light-emitting diode, which, in turn, can result in a decrease in the light extraction efficiency. Conventional methods for enhancing light extraction efficiency normally involve increasing surface roughness of the laminated layered structure of the light-emitting diode so as to reduce total internal reflection of light in the light-emitting diode. However, in UV, blue, or green light emitting diodes, since the p-cladding layer thereof is relatively thin, which has a layer thickness required to be not greater than 200 nm, surface roughening of the same tends to cause short-circuiting of the light emitting diode and has an adverse effect on the electrical properties of the light emitting diode. U.S. Pat. No. 7,132,677 discloses a light emitting device including a plurality of nanorods, each of which has a n-cladding layer, an active layer formed on the n-cladding layer, and a p-cladding layer formed on the active layer. Although the light-emitting diode thus formed can enhance the light extraction efficiency, manufacturing of the same is complex and expensive.

SUMMARY OF THE INVENTION

Therefore, the object of the present invention is to provide a light-emitting device that can overcome the aforesaid drawbacks associated with the prior art.

Another object of this invention is to provide a method for making the light-emitting device.

According to one aspect of the present invention, a light-emitting device capable of emitting a light having a wavelength ranging from 300 to 550 nm comprises: a substrate; a p-type semiconductor layer disposed on the substrate; an active layer disposed on the p-type semiconductor layer; a n-type semiconductor layer disposed on the active layer and having a waveguide-disposing surface; first and second electrodes coupled electrically to the n-type semiconductor layer and the substrate, respectively; and a waveguide structure formed on the waveguide-disposing surface of the n-type semiconductor layer and having a plurality of spaced apart nanorods extending from the waveguide-disposing surface.

According to another aspect of this invention, there is provided a method for making a light-emitting device capable of emitting a light having a wavelength ranging from 300 to 550 nm. The method comprises: (a) forming a multilayered structure on a first substrate, the multilayered structure including a n-type semiconductor layer disposed on the first substrate, an active layer disposed on the n-type semiconductor layer, and a p-type semiconductor layer disposed on the active layer; (b) attaching the multilayered structure to a second substrate and removing the first substrate from the multilayered structure so as to expose the n-type semiconductor layer; and (c) etching the n-type semiconductor layer to form a waveguide structure thereon. The waveguide structure includes a plurality of spaced apart nanorods extending from the n-type semiconductor layer.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 1:
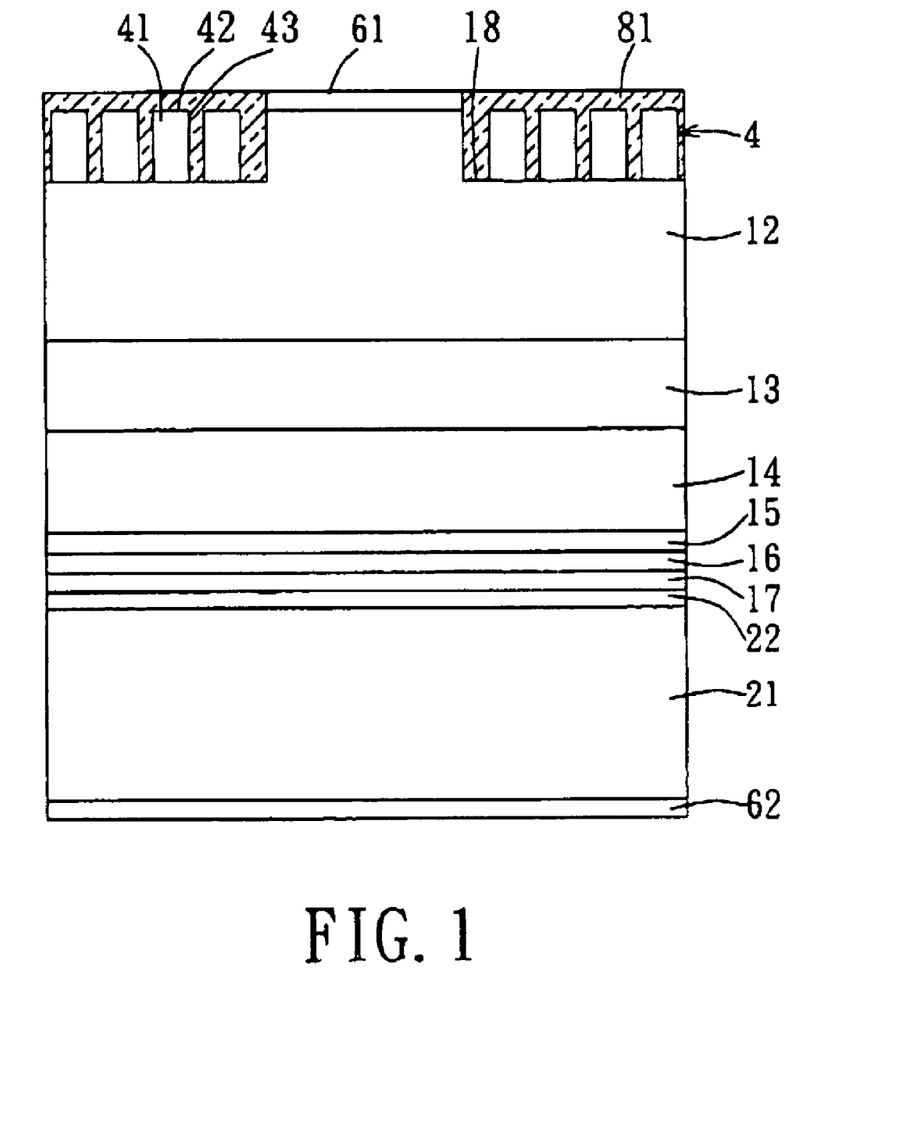
FIG. 1 is a fragmentary schematic view of the preferred embodiment of a light-emitting device according to this invention.

FIG. 1 illustrates the preferred embodiment of a light-emitting device capable of emitting UV, blue, or green light, i.e., a light having a wavelength ranging from 300 to 550 nm, according to this invention.

The light-emitting device includes: a substrate 21; a p-type semiconductor layer 14 disposed on the substrate 21; an active layer 13 disposed on the p-type semiconductor layer 14; a n-type semiconductor layer 12 disposed on the active layer 13 and having a waveguide-disposing surface 18; first and second electrodes 61, 62 coupled electrically to the n-type semiconductor layer 12 and the substrate 21, respectively, for applying a working voltage thereto; and a waveguide structure 4 formed on the waveguide-disposing surface 18 of the n-type semiconductor layer 12 and having a plurality of spaced apart nanorods 41 extending from the waveguide-disposing surface 18. Each of the nanorods 41 has a length not less than 200 nm. The p-type semiconductor layer 14 has a layer thickness not greater than 200 nm.

In this embodiment, each of the nanorods 41 has a free end 42 and a peripheral surface 43 extending from the waveguide-disposing surface 18 of the n-type semiconductor layer 12 to the free end 42 of the nanorod 41 in a normal direction relative to the substrate 21. Preferably, the nanorods 41 are cylindrical in shape.

In this embodiment, the light-emitting device further includes a protective layer 81 disposed on the n-type semiconductor layer 12, enclosing the waveguide structure 4, and having a refractive index greater than that of air (n=1) and smaller than that of the n-type semiconductor layer 12 (n=2.4~2.5) so as to reduce total internal reflection of light in the light-emitting device.

Preferably, the protective layer 81 is transparent and is made from an insulator material selected from the group consisting of $SiO_2$ and silicon nitride-based compound ($Si_xN_y$).

Preferably, the substrate 21 is made from a conductive material, or from a material selected from the group consisting of Si, SiC, GaAs, GaP, MgO, ZnO, GaN, AlN, InN, Cu, Mo, W, Al, Au, Zn, Sn, and combinations thereof. In this embodiment, the substrate 21 is made from Si.

In this embodiment, the light-emitting device further includes a reflective layer 16 disposed between the substrate 21 and the p-type semiconductor layer 14, and a current diffusion layer 15 disposed between the reflective layer 16 and the p-type semiconductor layer 14 so as to enhance light extraction efficiency.

Preferably, the reflective layer 16 is made from metal. The current diffusion layer 15 is transparent.

In this embodiment, the active layer 13 is capable of generating a light having a wavelength of about 450 nm.

Preferably, each of the n-type and p-type semiconductor layers 12, 14 is made from a material selected from the group consisting of GaN, AlN, InN, and combinations thereof.

A method for making the light-emitting device according to this invention is described as follows. Referring to FIGS. 2 to 8, the method includes the steps of: (a) forming a multilayered structure 1 on a first substrate 11 (see FIG. 2), the multilayered structure 1 including a n-type semiconductor layer 12 disposed on the first substrate 11, an active layer 13 disposed on the n-type semiconductor layer 12, a p-type semiconductor layer 14 disposed on the active layer 13, a current diffusion layer 15 disposed on the p-type semiconductor layer 14, a reflective layer 16 disposed on the current diffusion layer 15, and a first Au—Sn alloy layer 17 disposed on the reflective layer 16; (b) attaching the multilayered structure 1 to a second substrate 21 through a second Au—Sn alloy layer 22 (see FIGS. 3 and 4) by eutectic bonding the first and second Au—Sn alloy layers 17, 22 together, and removing the first substrate 11 from the multilayered structure 1 so as to expose the n-type semiconductor layer 12 (see FIG. 5); (c) forming a patterned mask 3' on the n-type semiconductor layer 12 and etching the n-type semiconductor layer 12 to form a waveguide structure 4 thereon (see FIGS. 6 and 7), the waveguide structure 4 including a plurality of the nanorods 41 extending from the n-type semiconductor layer 12 in a normal direction relative to the second substrate 21 or the multilayered structure 1; and (a) removing the patterned mask 3' from the waveguide structure 4.

Figure 6:
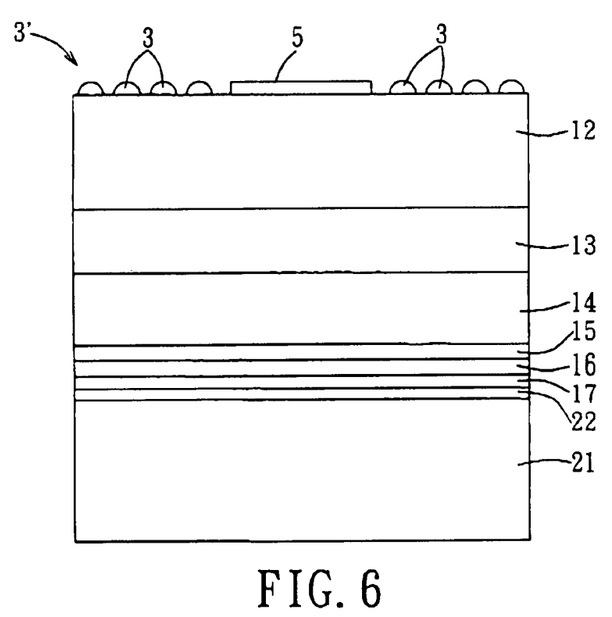
Figure 7:
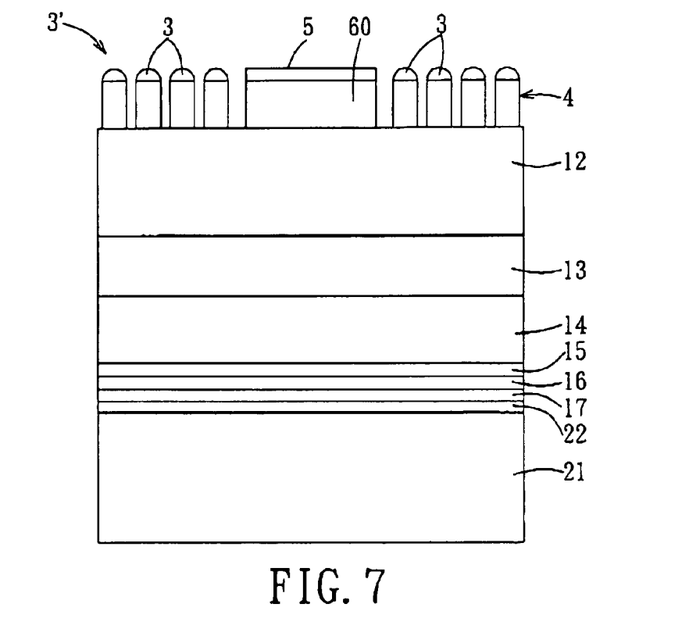

In this embodiment, the etching operation in step (c) is conducted through dry etching techniques using a particle-containing material as the patterned mask 3'. Preferably, the dry etching operation is conducted through inductively coupled plasma reactive ion etching (ICPRIE) techniques.

Preferably, the particle-containing material contains hemispherical particles 3 having a diameter less than 0.8 μm.

The hemispherical particles 3 are preferably made from an inorganic oxide compound, and are more preferably made from a material selected from the group consisting of TiO, $SiO_2$, and $Al_2O_3$, and combinations thereof. In this embodiment, the particles 3 are made from TiO material.

Figure 2:
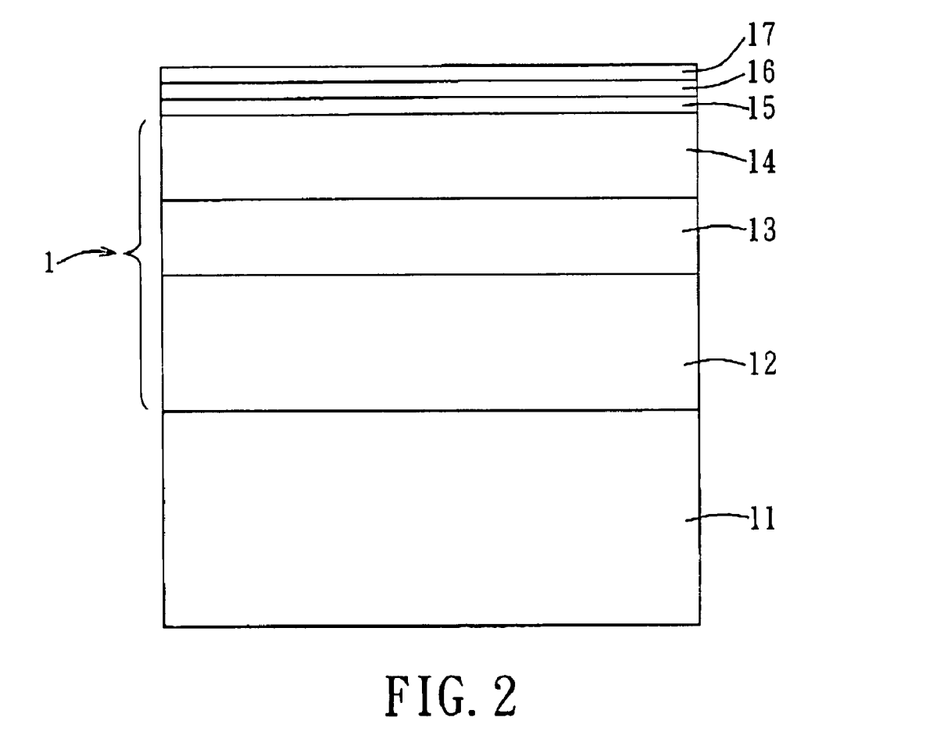
FIGS. 2 to 8 are schematic views to illustrate consecutive steps of the preferred embodiment of a method for making the light-emitting device.

In this embodiment, the formation of each of the n-type and p-type semiconductor layers 12, 14, and the active layer 13 of the multilayered structure 1 in step (a) is conducted through epitaxial growth techniques. The removing operation in step (b) is conducted through laser lift-off techniques.

Preferably, a protective Layer 81 is formed on the n-type semiconductor layer 12 (see FIG. 1) through plasma enhanced chemical vapor deposition (PECVD) techniques or spin-on-glass coating (SOG) techniques.

Preferably, the formation of each of the current diffusion layer 15 and the reflective layer 16 of the multilayered structure 1 in step (a) is conducted through evaporation deposition techniques.

The merits of the method of making the light-emitting device of this invention will become apparent with reference to the following Examples and Comparative Example.

EXAMPLES

Example 1

The light-emitting device of Example 1 was prepared by the following steps.

First, an epitaxial layered structure 1, which includes a n-type GaN semiconductor layer 12, an active layer 13 (a multi quantum well having ten pairs InGaN/GaN), and a p-type GaN semiconductor layer 14 having a layer thickness of about 200 nm, was grown on a sapphire substrate 11 ($Al_2O_3$) having a diameter of 2 inches and a layer thickness of 500 μm through metal organic vapor phase epitaxy (MOVPE) techniques.

It is noted that formation of the epitaxial layered structure can also be conducted by molecular beam epitaxy (MBE) techniques or hydride vapor phase epitaxy (HVPE) techniques.

Subsequently, a current diffusion layer 15 made from ITO and having a thickness of approximately 200 nm was deposited on the p-type GaN semiconductor layer 14 by e-beam evaporation. A reflective layer 16 made from Al and having a thickness of approximately 500 nm was deposited on the current diffusion layer 15 by e-beam evaporation. A first Au—Sn alloy layer 17 having a layer thickness of 2 μm was deposited or the reflective layer 16 by evaporation deposition techniques.

Figure 3:
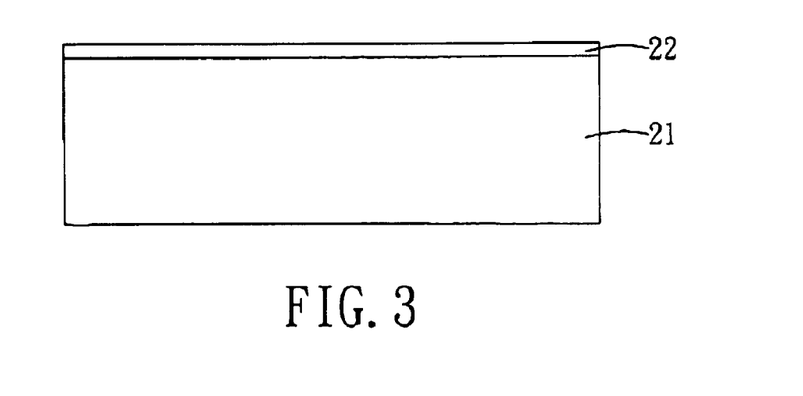

In addition, a second Au—Sn alloy layer 22 having a layer thickness of 2 μm was deposited on a silicon substrate 21, which has a diameter of 2 inches and a thickness of 500 μm, by evaporation deposition techniques (see FIG. 3).

Figure 4:
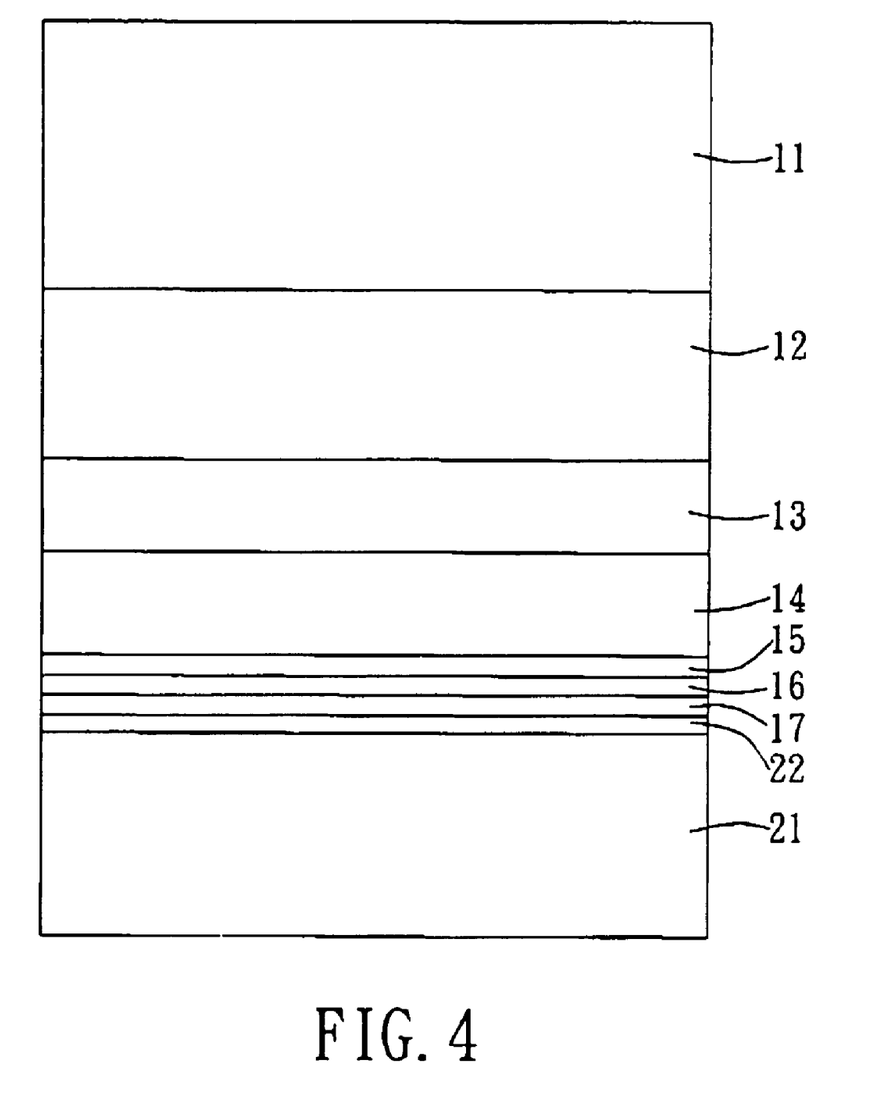
Figure 5:
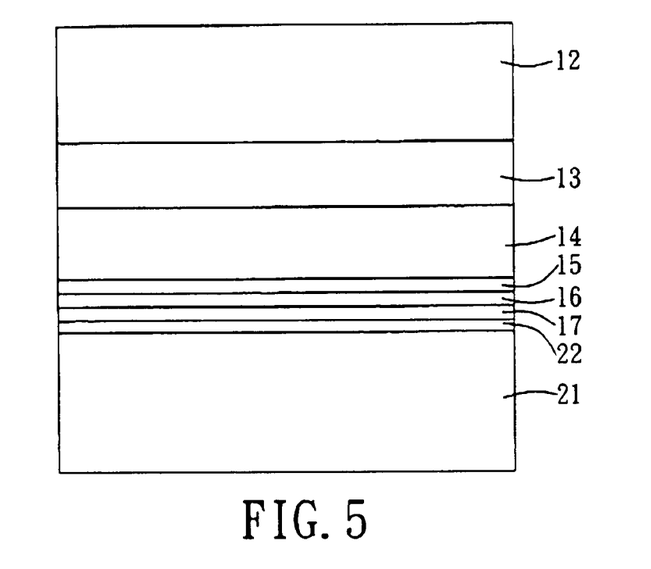

The first and second Au—Sn alloy layers 17, 22 were subjected to eutectic bonding under a temperature of 350° C. to bond them together (see FIG. 4). A laser having a wavelength of 248 nm ($25 \times 10^9$ s pulse period, laser spot size=1.2 mm×1.2 mm) was applied to a boundary between the sapphire substrate 11 and the n-type GaN semiconductor layer 12 so as to break bonding therebetween and so as to separate the sapphire substrate 11 from the n-type GaN semiconductor layer 12 for exposing the n-type GaN semiconductor layer 12 (see FIG. 5). Hydrochloric acid was then used to clean the boundary, followed by inductively coupled plasma reactive ion etching of the boundary so as to completely remove residue of the sapphire substrate 11 thereon.

An etching mask material of a plurality of hemispherical particles 3 having a diameter less than 0.8 μm and made from TiO was dispersed in an alcohol solvent to form a particle-containing solution which was then applied onto the n-type GaN semiconductor layer 12 by spin coating techniques at a rotation speed of 6000 rps. After evaporation of the solvent, the hemispherical particles 3 were adhered firmly to the n-type GaN semiconductor layer 12 as an etching mask and had a distributed density of $3 \times 10^9$ particles/cm$^2$.

Figure 9:
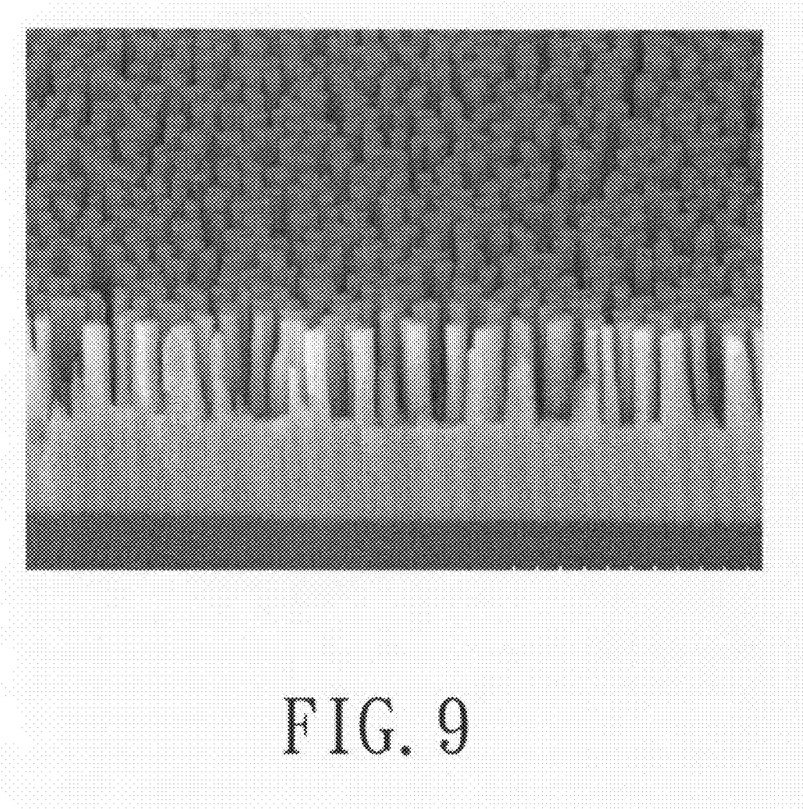
FIG. 9 is a scanning electron microscopic view of a plurality of nanorods formed on a n-type semiconductor layer of the preferred embodiment.

The n-type GaN semiconductor layer 12 having the hemispherical particles 3 disposed thereon was then subjected to inductively coupled plasma reactive ion etching (ICPRIE) for an etching time of about 2 minutes so as to form a plurality of nanorods 41 thereon. Each of the nanorods 41 had a length of approximately 200 nm. Hydrofluoric acid was then used to remove the hemispherical particles 3 from the nanorods 41. FIG. 9 is a scanning electron microscope (SEM) image showing the nanorods 41 on the n-type GaN semiconductor layer 12 at 20000× magnification.

Figure 8:
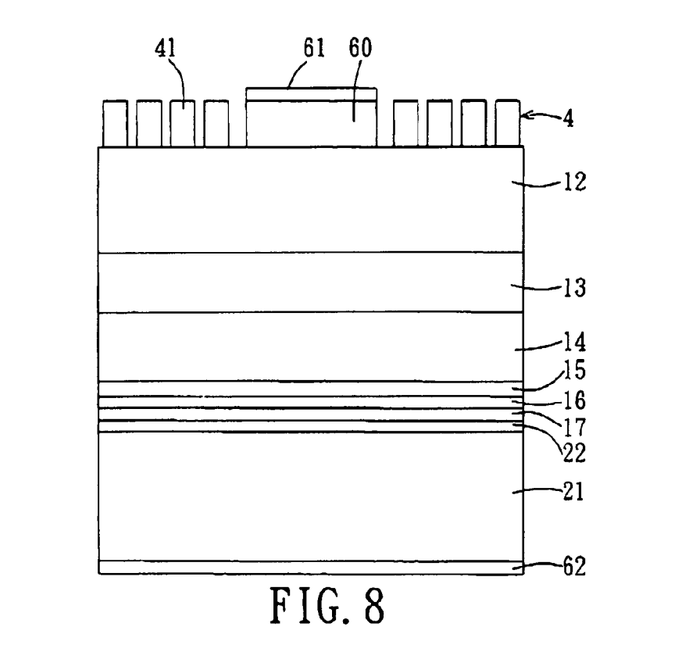

Referring to FIGS. 6 to 8, the first and second electrodes 61, 62 were then formed on the n-type GaN semiconductor layer 12 and the silicon substrate 21, respectively. Specifically, in order to form the first electrode 61, a pre-formed SiO$_2$ layer 5 having a thickness of 3000 Å was deposited on a portion 60 of the n-type GaN semiconductor layer 12 prior to the step of forming the hemispherical particles 3 thereon so that the portion 60 of the n-type GaN semiconductor layer 12 was prevented from being etched during formation of the nanorods 41. The pre-formed SiO$_2$ was then removed by hydrofluoric acid after the step of forming the plurality of nanorods 41. The first electrode 61 was formed on the portion 60 of the n-type GaN semiconductor layer 12 by evaporation deposition techniques.

Preferably, the first electrode 61 is a Ti/Al/Ti/Au contact electrode, and the second electrode 62 is a Ti/Au contact electrode.

Example 2

The light-emitting device of Example 2 was prepared by steps similar to those of Example 1, except that the etching time was about 5 minutes and that the nanorods 41 thus formed had a length of approximately 1000 nm.

Comparative Example 1

The light-emitting device of Comparative Example 1 was prepared by steps similar to those of Example 1, except that Comparative Example 1 was not formed with the nanorods 41 on the n-type GaN semiconductor layer 12.

Figure 10:
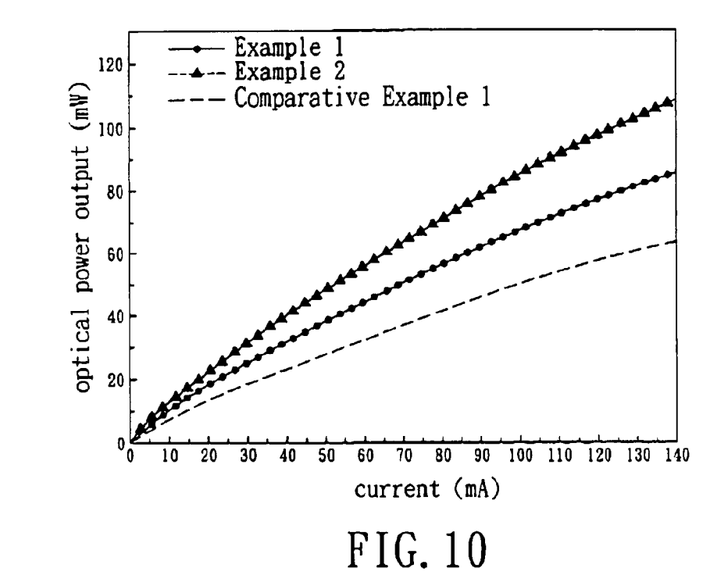
FIG. 10 is a graph showing output power/current relation of Comparative Example 1 and Examples 1 and 2 of the preferred embodiment.

FIG. 10 is a graph showing optical power outputs for the light-emitting devices of Example 1, Example 2 and Comparative Example 1. The optical power outputs of Example 1 and Example 2 are higher than that of Comparative Example 1. Moreover, the optical power output of Example 2 is higher than that of Example 1. For example, the optical power output is 22.3 mW for Example 2 and 17.5 mW for Example 1 at a current of 20 mA.

The results show that the nanorods 41 on the n-type GaN semiconductor layer 12 can improve considerably the optical power output, especially when the nanorods 41 have a length not less than 200 nm.

Figure 11:
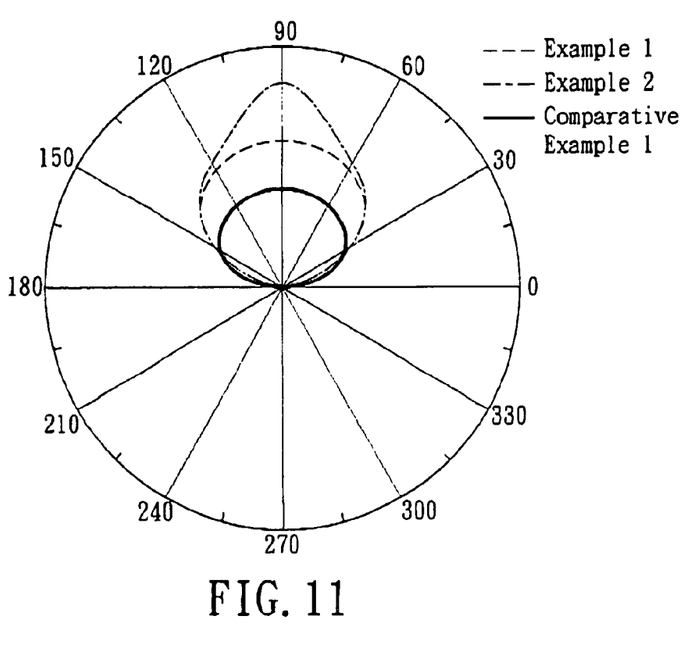
FIG. 11 is a graph showing Far-Field Pattern of Comparative Example 1 and Examples 1 and 2 of the preferred embodiment.

FIG. 11 is a graph showing Far-field Patterns of the light-emitting devices of Example 1, Example 2 and Comparative Example 1. The results show that each of Examples 1 and 2 has a higher light extraction efficiency (encircled areas by the dashed lines) compared to that of Comparative Example 1 (encircled area by the solid line), and a higher intensity in the normal direction relative to the multilayered structure 1.

As illustrated in the aforesaid light-emitting tests, the longer the nanorods 41 on the n-type GaN semiconductor layer 12 are, the higher will be the light extraction efficiency.

The merits of forming the protective layer 81 on the n-type semiconductor layer 12 will become apparent with reference to the following simulations.

SIMULATION

The following simulation examples and simulation comparative example were carried out using a simulation tool, i.e., a software named ASAP® developed by Breault Research Organization for analyzing light extraction efficiency of a light-emitting device.

Simulation Example 1

SE1

Figure 12:
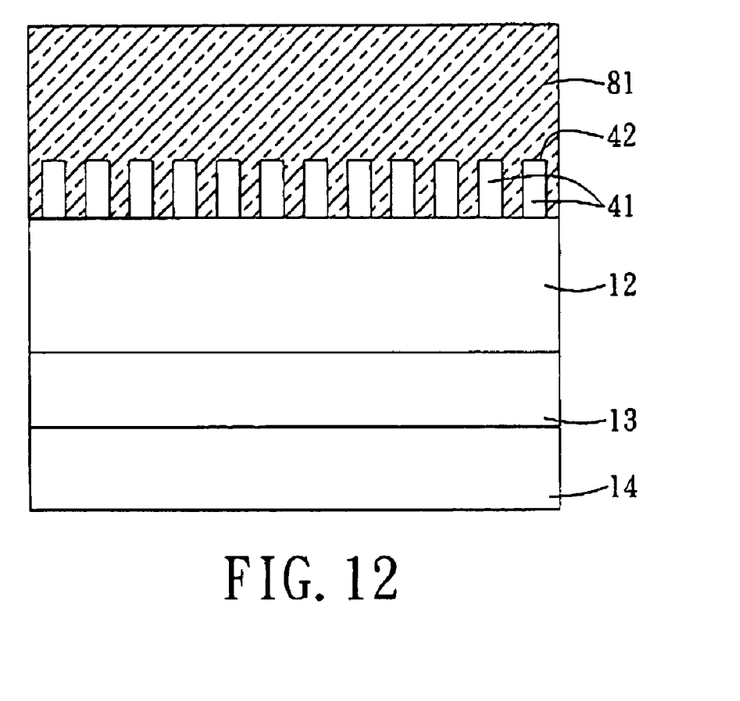
FIG. 12 is a schematic view to illustrate a protective layer formed on the n-type semiconductor layer of the preferred embodiment.

In this simulation, the parameters set for the light-emitting device having a structure shown in FIG. 12 are as follows: The semiconductor material was GaN. The p-type semiconductor layer 14 has a layer thickness of 200 nm. The active layer 13 has a layer thickness of 200 nm. The n-type semiconductor layer 12 has a layer thickness of 2 μm (including the length of the nanorods 41). The nanorods 41 have a length of 200 nm. The protective layer 81 has a portion disposed above the free ends 42 of the nanorods 41 and having a thickness of 2 μm.

Simulation Example 2

SE2

Figure 13:
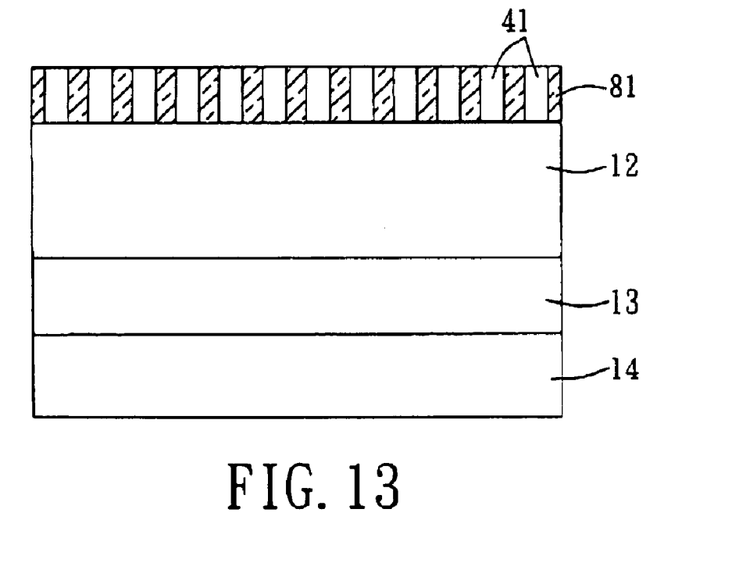
FIG. 13 is a schematic view to illustrate the protective layer filled among and flush with free ends of the nanorods on the n-type semiconductor layer of the preferred embodiment.

Simulation Example 2 differs from the previous simulation example in that the protective layer 81 is substantially flush with the free ends 42 of the nanorods 41 (see FIG. 13).

Simulation Example 3

SE3

Figure 14:
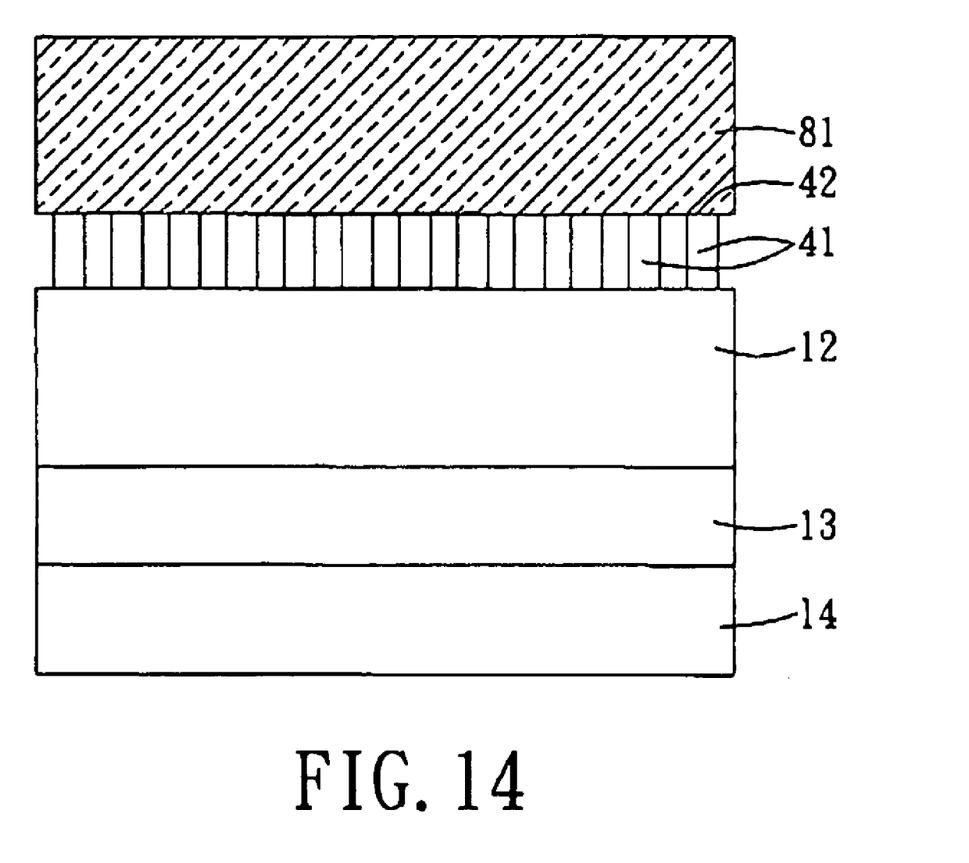
FIG. 14 is a schematic view to illustrate the protective layer formed on the free ends of the nanorods of the preferred embodiment.

Simulation Example 3 differs from the previous simulation examples in that the protective layer 81 is formed on the free ends 42 of the nanorods 41 (see FIG. 14).

Simulation Example 4

SE4

Simulation Example 4 differs from the previous simulation examples in that the light-emitting device of this simulation example does not include the protective layer 81.

Simulation Comparative Example 1

SC1

Simulation Comparative Example 1 differs from the previous simulation examples in that the light-emitting device does not include the nanorods 41 and the protective layer 81.

Table 1 shows the simulation results of light intensity for Simulation Examples 1-4 and Simulation Comparative Example 1.

Improvement was calculated based on the following equation,

Improvement=[(SE−SCE)/SCE]×100%, where SE represents the intensity of the Simulation Example and SCE represents the intensity of Simulation Comparative Example calculated from the simulation.

TABLE 1

| | Intensity | | | Improvement | | |
|---|---|---|---|---|---|---|
| | Top (a.u.) | Sidewall (a.u.) | Total (a.u.) | Top (%) | Sidewall (%) | Total (%) |
| SE1 | 0.486435 | 0.177715 | 0.66415 | 195.2026 | 1740.46 | 280.74 |
| SE2 | 0.444151 | 0.086726 | 0.530877 | 169.5415 | 798.156 | 204.3375 |
| SE3 | 0.338945 | 0.141123 | 0.480068 | 105.6954 | 1361.51 | 175.2103 |
| SE4 | 0.292899 | 0.021928 | 0.317564 | 77.7514 | 127.092 | 80.4823 |
| SCE1 | 0.164780 | 0.009656 | 0.174437 | — | — | — |

The simulation results show that the improvement of the light-emitting device having the nanorods 41 can reach 80% in intensity and even reach 280% when the light-emitting device further includes the protective layer 81 disposed on the n-type semiconductor layer 12.

It has thus been shown that, by forming the nanorods 41 on the n-type semiconductor layer 12 as a waveguide structure 4 and the protective layer 81 disposed on the n-type semiconductor layer 12 as a buffer layer for reducing difference in refraction index between the light-emitting device and air, the aforesaid drawbacks associated with the prior art can be eliminated.

With the invention thus explained, it is apparent that various modifications and variations can be made without departing from the spirit of the present invention. It is therefore intended that the invention be limited only as recited in the appended claims.

What is claimed is:

1. A method for making a light-emitting device capable of emitting a light having a wavelength ranging from 300 to 550 nm, comprising:
   (a) forming a multilayered structure on a first substrate, the multilayered structure including a n-type semiconductor layer disposed on the first substrate, an active layer disposed on the n-type semiconductor layer, and a p-type semiconductor layer disposed on the active layer;
   (b) attaching the multilayered structure to a second substrate and removing the first substrate from the multilayered structure to expose the n-type semiconductor layer;
   (c) depositing particles on the n-type semiconductor layer as an etching mask; and
   (d) etching an exposed portion of the n-type semiconductor layer peripheral to the particles to form a portion of the n-type semiconductor layer as a waveguide structure, the waveguide structure including a plurality of spaced apart nanorods extending from the n-type semiconductor layer.

2. The method of claim 1, wherein said p-type semiconductor layer has a layer thickness not greater than 200 nm.

3. The method of claim 1, wherein each of the nanorods extends in a normal direction relative to the second substrate and has a length not less than 200 nm.

4. The method of claim 1, wherein the particles are dispersed in a solution to form a particle-containing solution, the particle-containing solution being applied onto the n-type semiconductor layer by a spin coating technique, and the etching operation in step (d) is conducted through a dry etching technique.

5. The method of claim 4, wherein the dry etching operation in step (d) is conducted through an inductively coupled plasma reactive ion etching (ICPRIE) technique.

6. The method of claim 4, wherein the particles are hemispherical and have a diameter less than 0.8 μm.

7. The method of claim 6, wherein the particles are made from an inorganic oxide compound.

8. The method of claim 6, wherein the particles are made from a material selected from the group consisting of TiO, $SiO_2$, and $Al_2O_3$, and combinations thereof.

9. The method of claim 1, wherein the attaching and removing operations in step (b) are conducted through metal bonding techniques and laser lift-off techniques, respectively.

* * * * *